(12) United States Patent
Nitto et al.

(10) Patent No.: US 7,633,215 B2
(45) Date of Patent: Dec. 15, 2009

(54) ELECTRO-MECHANICAL ENERGY CONVERTER AND VIBRATION WAVE DRIVING

(75) Inventors: Kiyoshi Nitto, Saitama (JP); Yutaka Maruyama, Taito-ku (JP); Takayuki Tsukimoto, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/249,820

(22) Filed: Oct. 10, 2008

(65) Prior Publication Data

US 2009/0039735 A1 Feb. 12, 2009

Related U.S. Application Data

(63) Continuation of application No. 11/298,796, filed on Dec. 9, 2005, now Pat. No. 7,459,832.

(30) Foreign Application Priority Data

Dec. 21, 2004 (JP) ............................. 2004-369438

(51) Int. Cl.
*H01L 41/08* (2006.01)
(52) U.S. Cl. .................................. 310/366; 310/323.06

(58) Field of Classification Search .................. 310/328, 310/323.01–323.19, 365–366
See application file for complete search history.

(56) References Cited

U.S. PATENT DOCUMENTS

| 3,416,233 | A | 12/1968 | Steele |
| 5,345,137 | A | 9/1994 | Funakubo et al. |
| 5,814,919 | A * | 9/1998 | Okumura ..................... 310/366 |
| 6,930,436 | B2 | 8/2005 | Tsukimoto et al. |
| 6,989,624 | B2 | 1/2006 | Tsukimoto et al. |
| 7,183,695 | B2 * | 2/2007 | Kienzler et al. ............. 310/328 |

FOREIGN PATENT DOCUMENTS

JP 2003-47266 A 2/2003

* cited by examiner

*Primary Examiner*—Walter Benson
*Assistant Examiner*—Karen B Addison
(74) *Attorney, Agent, or Firm*—Canon U.S.A., Inc. I.P. Division

(57) ABSTRACT

At least one exemplary embodiment is directed to an electro-mechanical energy converter and a vibration wave driving apparatus that can facilitate miniaturization, high power, low cost and low voltage drive, by using a polygonal piezoelectric element with a plurality of electrode films divided by a boundary of electrode film on the polygonal piezoelectric element.

7 Claims, 6 Drawing Sheets

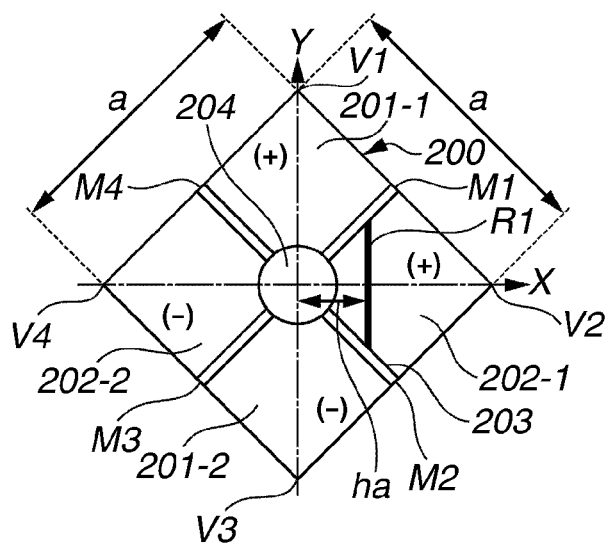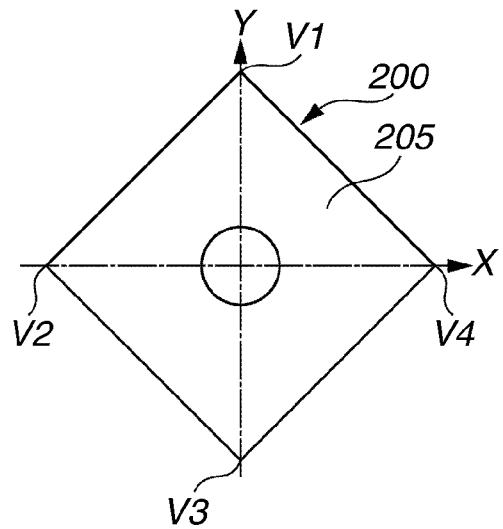
FIG.3A  FIG.3B
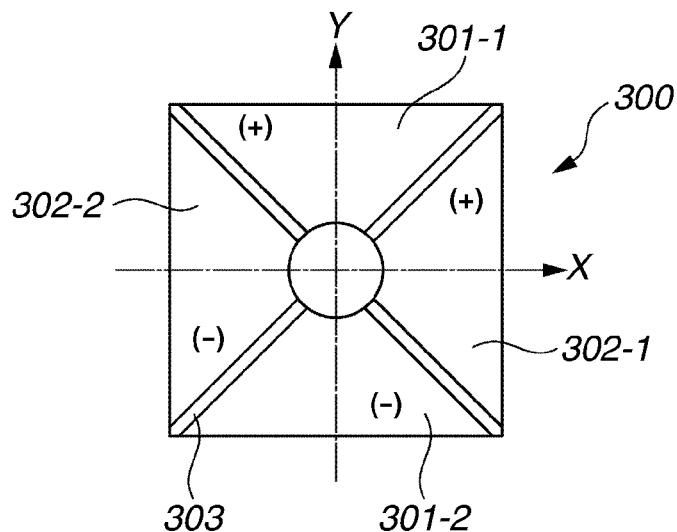
FIG.4

ELECTRO-MECHANICAL ENERGY CONVERTER AND VIBRATION WAVE DRIVING

CROSS-REFERENCE TO RELATED APPLICATIONS

This application is a continuation of U.S. patent application Ser. No. 11/298,796 filed Dec. 9, 2005, which claims priority to Japanese Patent Application No. 2004-369438 filed Dec. 21, 2004, both of which are hereby incorporated by reference herein in their entirety.

BACKGROUND OF THE INVENTION

1. Field of the Invention

The present invention relates to an electro-mechanical energy converter and a vibration wave driving apparatus.

2. Description of the Related Art

In general, a vibration wave driving apparatus such as an ultrasonic motor (vibration wave motor) includes a vibrator which generates driving vibration as a basic configuration. The vibrator moves a contact body, which is pressurized by the vibrator, by using the driving vibration. The vibration wave driving apparatus has been used for camera lens driving, and conventional systems can take the form of an annular-type and a rod-type vibration wave driving apparatuses.

An example of the vibrator, which constitutes the basic configuration of the vibration wave driving apparatus, is illustrated in FIG. 10. A vibrator 900 includes a shaft e1, the bottom end of which is threaded, and a first elastic body a1 which is externally fitted on the shaft e1, is made of metal, and cylindrical with a small diameter. Further, the vibrator 900 includes a disk-shaped elastic body d1 which is externally fitted on the shaft e1 to come into contact with the first elastic body a1, and an electro-mechanical energy converter c1 which is externally fitted on the shaft e1 to come into contact with the disk-shaped elastic body d1. Further, the vibrator 900 includes a flexible substrate 11 which is externally fitted on the shaft e1 to come into contact with the electro-mechanical energy converter c1 in order to supply electricity to the electro-mechanical energy converter c1. Further, the vibrator 900 includes a metal-made, large diameter and disk-shaped second elastic body b1 which is connected with thread to the bottom end of the shaft e1, and sandwiches and fixes the disk-shaped elastic body d1, the electro-mechanical energy converter c1 and the flexible substrate 11. (for example, refer to Japanese Patent Application Laid-Open No. 2003-47266)

The electro-mechanical energy converter is not limited to the shape shown in FIG. 10. For example, as shown in FIGS. 11A and 11B, a cylindrical piezoelectric element laminated with a disk shaped piezoelectric element 1000 can be employed. In this laminated-piezoelectric element, first, a plurality of sheets made of a piezoelectric material which forms an electrode on the surface thereof are laminated to form a plate type board having a multi-layer structure, and this board is divided into a plurality of square lumps. Thereafter, the external shape of the divided square lumps is processed to form a disk shape. Thus the laminated-piezoelectric element is manufactured. On the surface of this piezoelectric element 1000, divided electrode films of a quadrant-shape 1001-1, 1001-2, 1002-1 and 1002-2 are formed split into four parts by a non-electrode part (electrode film boundary part) (FIG. 11A) Then, on the back of the piezoelectric element 1000, electrode film 1004 is formed (FIG. 11B) in its entirety. The divided electrode films 1001-1 and 1002-1 are charged with a plus voltage, and the divided electrode films 1001-2 and 1002-2 are charged with a minus voltage (for example, refer to U.S. Pat. No. 3,416,233).

There is a request for miniaturization of the vibration wave driving apparatus which uses the piezoelectric element laminated with the above-described disk shaped piezoelectric element 1000. If the piezoelectric element 1000 is simply made small with its disk shape intact, the area of an electrode film of the piezoelectric element 1000 becomes small and the output of the vibration wave driving apparatus becomes low.

Theoretically, the amplitude of the output of the vibration wave driving apparatus depends on a conversion rate from the displacement in a thickness direction of the piezoelectric element to the displacement of bending vibration of the vibrator. Since the conversion rate of a polygonal piezoelectric element is higher than the disk shaped piezoelectric element 1000 (FIGS. 11A and 11B), the output of the vibration wave driving apparatus using the polygonal piezoelectric element becomes higher than that using the disk shaped piezoelectric element 1000 (FIGS. 11A and 11B).

Therefore, an attempt has been made to change a form of the piezoelectric element 1000 from a disk shape to a polygon such as a square, thereby implementing the vibration wave driving apparatus which produces a high output. A two-phase AC signal having a phase difference of 90 degrees with each other is applied to the electro-mechanical energy converter c1 having driving phases which are out of phase with each other by 90 degrees. Thus, a progressive traveling wave is induced on the disk-shaped elastic body d1. The vibration wave driving apparatus utilizes frictional force produced by bonding with pressure to the disk-shaped elastic body d1 having abrasion resistance. Thus, the vibration wave driving apparatus drives a contact body using the traveling wave on the disk-shaped elastic body d1 (for example, refer to Japanese Patent Application Laid-Open No. 2003-47266).

However, with respect to a small vibration wave driving apparatus using the above-described polygonal piezoelectric element, the optimization of the shape of the divided electrode film has not been considered. Accordingly, if the divided electrode film is ingeniously shaped, the output can be further improved.

SUMMARY OF THE INVENTION

At least one exemplary embodiment is directed to an electro-mechanical energy converter that generates vibration by applying an AC voltage to a plurality of electrode films formed on a surface thereof and includes a plurality of electrode films formed on the surface of the electro-mechanical energy converter, each electrode film separated from its neighbor by a non-conductive part boundary, wherein the plurality of electrode films and non-conductive part boundary together define a polygonal area.

Accordingly, another exemplary embodiment is directed to an electro-mechanical energy converter which includes a plurality of layers alternately laminated with a layer having a plurality of electrode films and a material having an electro-mechanical energy converting function, that generates vibration by applying an AC voltage to the plurality of electrode films, and includes a plurality of electrode films on the same plane, each electrode film separated from it's neighbor by a boundary of non-conductive part, where the plurality of electrode films and non-conductive part boundary together define a polygonal area in the plane.

Accordingly, another exemplary embodiment is directed to a vibration wave driving apparatus including (a) a vibrator having an electro-mechanical energy converter which includes a plurality of layers alternately laminated with a layer having a plurality of electrode films and a material having an electro-mechanical energy converting function that generates vibration by applying an AC voltage to the plurality of electrode films, an elastic body which comes into contact with the electro-mechanical energy converter, and a shaft which passes through the inside of the electro-mechanical energy converter and the elastic body to operatively connect them, where the vibrator generates a plurality of bending vibrations in a direction substantially orthogonal to the shaft by the vibration generated by the electro-mechanical energy converter, and the plurality of bending vibrations are combined to induce circular motion on the surface of the elastic body; and (b) a contact body which comes into contact with the vibrator and is driven by the circular motion induced on the surface of the elastic body, where the electro-mechanical energy converter includes a plurality of electrode films on the same plane, each electrode film separated from its neighbor by a boundary of non-conductive part, a cross section of the plane is a polygonal area and the electrode film boundary is provided in an area that does not include the vertex of the polygonal area.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments.

FIG. 3A illustrates a diagram showing an electrode pattern on the surface of a piezoelectric element and FIG. 3B illustrates a diagram showing the electrode pattern on the back of the piezoelectric element in an electro-mechanical energy converter shown in FIG. 1.

FIG. 4 is a diagram which illustrates one example of the electrode pattern compared with the electrode pattern of the piezoelectric element shown in FIGS. 3A and 3B.

DETAILED DESCRIPTION OF THE EMBODIMENTS

Figure 1:
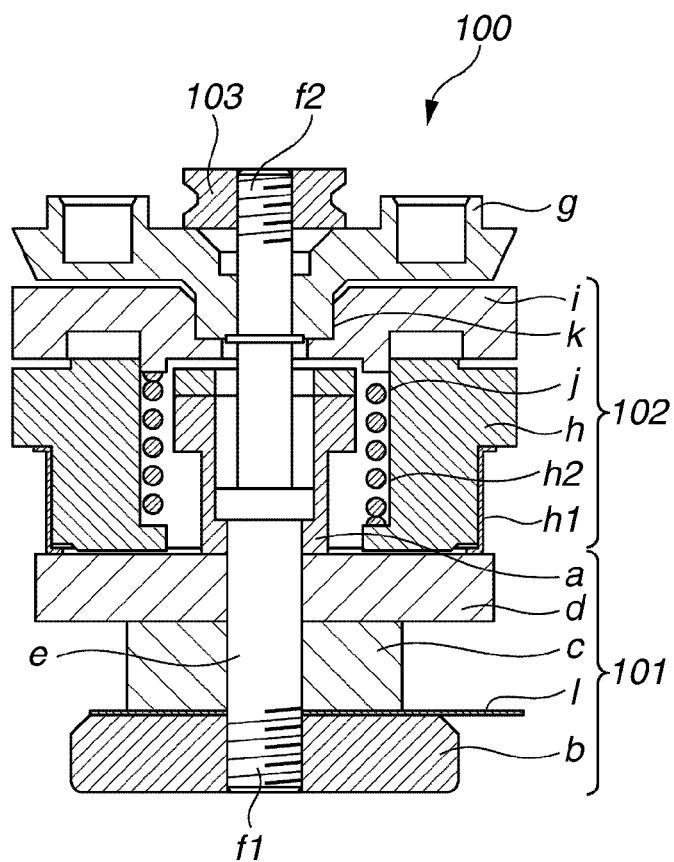
FIG. 1 illustrates a diagram schematically showing a configuration of a vibration wave driving apparatus according to at least one exemplary embodiment.

The following description of exemplary embodiment(s) is merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example the electrode control circuits may not be discussed. However, the details of these circuits as known by one of ordinary skill in the relevant art is intended to be part of the enabling discussion and included within exemplary embodiments where needed.

Notice that similar reference numerals and letters refer to similar items in the following figures, and thus once an item is defined in one figure, it may not be discussed or further defined in the following figures.

Exemplary embodiments of the invention will be described in detail with reference to the accompanying drawings. However, the size, the shape, the relative arrangement of constituent components shown as an example according to the exemplary embodiment can be changed as appropriate in accordance with a configuration of an apparatus and various conditions under which exemplary embodiments are applied. Thus exemplary embodiments are not limited to the examples discussed herein.

FIG. 1 illustrates a diagram schematically showing a configuration of a vibration wave driving apparatus according to at least one exemplary embodiment.

In FIG. 1, an ultrasonic motor 100 serving as a vibration wave driving apparatus includes a shaft e having a screw f1 at a bottom end and a connecting thread f2 at a top end. Further, the ultrasonic motor 100 includes a vibrator 101 and a rotator 102 externally fitted on the shaft e, a nut member 103 screwed on to the top end of the shaft e, and a motor fixing body g externally fitted on the shaft e.

The vibrator 101 is operatively connected to the shaft e. The vibrator 101 includes a first elastic body a that is externally fitted on the shaft e, made of metal, and cylindrical with a small diameter, and a disk-shaped elastic body d that is externally fitted on the shaft e to come into contact with the first elastic body a. Further, the vibrator 101 includes a rectangular and plate shaped electro-mechanical energy converter c that is externally fitted on the shaft e to come into contact with the disk-shaped elastic body d. Further, the vibrator 101 includes a flexible substrate 1 that is externally fitted on the shaft e to come into contact with the electro-mechanical energy converter c in order to supply electricity to the electro-mechanical energy converter c. Further, the vibrator 101 includes a second elastic body b that is metal-made, and cylindrical with large diameter. The second elastic body b is connected with thread to the bottom end of the shaft e, and sandwiches and fixes the disk-shaped elastic body d, the electro-mechanical energy converter c and the flexible substrate 1. In the first elastic body a, a position in its thrust direction is controlled by a flange mounted on the shaft e. Therefore, by tightening the second elastic body b, the disk-shaped elastic body d and the electro-mechanical energy converter c disposed between the first elastic body a and the second elastic body b are operatively connected (e.g., fixed).

The rotator 102 accommodates an urge coil spring j. Further, the rotator 102 includes a rotor h to which a contact spring h1 is fitted at one end which comes in contact with the disk-shaped elastic body d. The rotator 102 also includes an output gear i fitted and jointed to a spring case h2 so as not to relatively move in a radial direction. A joint part k of the motor fixing body g and the output gear i constitute a plain bearing.

Figure 2:
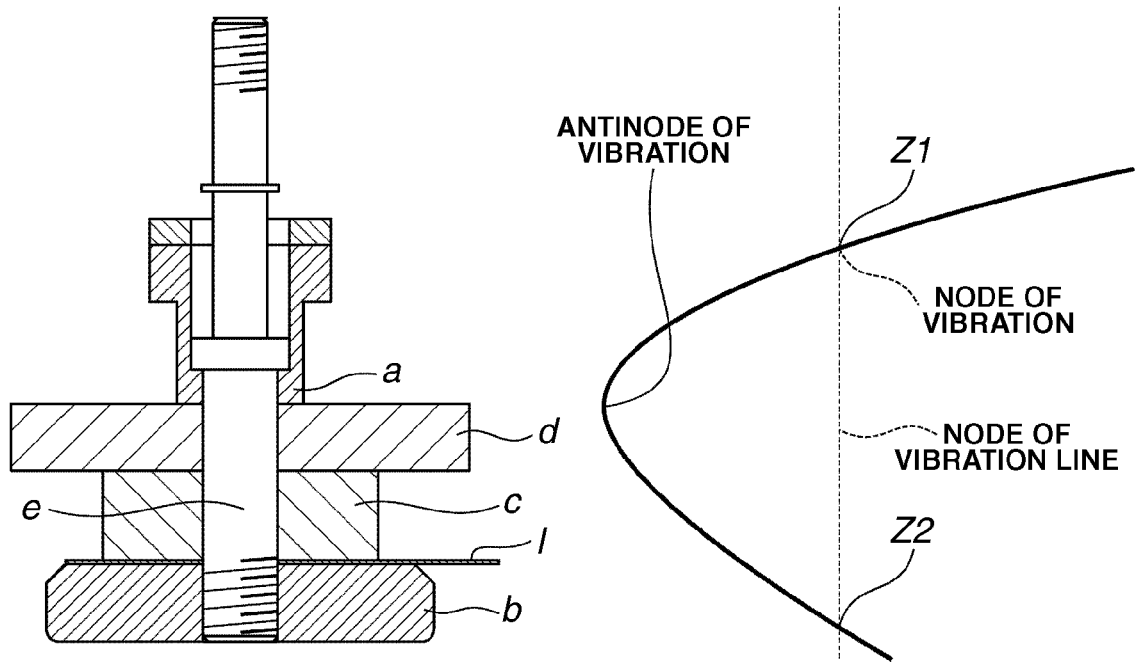
FIG. 2 illustrates a diagram showing a form of bending vibration which is displaced in a direction parallel to the drawing sheet in a vibrator of the vibration wave driving apparatus shown in FIG. 1.

When an AC electric field having a time phase difference of about π/2 is applied from a power supply (not shown) to the electro-mechanical energy converter c, the vibrator 101 excites at least two bending vibrations, which directions are substantially orthogonal to each other. Each direction of these two bending vibrations is substantially orthogonal to a longitudinal direction (axis direction) of the shaft e. One bending vibration is displaced in a direction parallel to the drawing sheet, whereas another bending vibration is displaced in a direction perpendicular to the drawing sheet. FIG. 2 illustrates a form of the bending vibration being displaced in a direction parallel to the drawing sheet. The two nodes of vibration Z1 and Z2, illustrate various positions in time about the shaft e of crest of two bending vibrations of planar electrodes. The oscillating nature of the line can be projected into a plane perpendicular to the shaft e, showing a net circular motion component in the perpendicular plane.

These two bending vibrations can be synchronized. Thus, the disk-shaped elastic body d which is in contact with the contact spring h1 fitted in the rotor h is displaced so as to circle while slanting around the shaft e when the shaft e stands still. Hence, circular motion is induced on the top end of the disk-shaped elastic body d and the rotor h pressed on the disk-shaped elastic body d having abrasion resistance is frictionally driven.

In this ultrasonic motor 100, a booster circuit is not required. Therefore, a cost-cutting can be achieved.

FIG. 3A is a diagram showing an electrode pattern on the surface of a piezoelectric element and FIG. 3B is a diagram showing the electrode pattern on the back of the piezoelectric element in the electro-mechanical energy converter c shown in FIG. 1.

In FIG. 3A, with respect to a piezoelectric element 200, a transverse cross section orthogonal to a thickness direction of the piezoelectric element is a square, and one side of the square has a length a. Note that other polygonal shapes can be used and the discussion herein is not intended to limit the shape of all exemplary embodiments to square piezoelectric elements. This piezoelectric element 200 includes divided electrode films 201-1, 201-2, 202-1 and 202-2 on the same plane (surface) which are divided into four parts by a non-electrode part, that is, a boundary 203 of non-conductive part. These divided electrode films 201-1, 202-1, 201-2 and 202-2 are provided in the areas including the vertexes V1, V2, V3 and V4 of the square respectively. The divided electrode films 201-1 and 202-1 are charged with a plus voltage and the divided electrode films 201-2 and 202-2 are charged with a minus voltage. Note in other exemplary embodiments the charging can be reversed, and it is the changing of the charging state that can cause motion.

Further, the electrode film boundary 203 is provided on a perpendicular from the mid-points M1, M2, M3 and M4 of each side of the square to the center of the square.

Further, the center part of the piezoelectric element 200 includes a hole 204.

In FIG. 3B, an electrode film 205 is formed over an entire back face of the piezoelectric element 200.

In a square piezoelectric element 200, bending strength α produced in an area R1 of the divided electrode film 202-1 is expressed by the following equation (1):

$$\alpha \propto \int_s de \cdot E \cdot ds \cdot ha \qquad (1)$$

where de denotes a piezoelectric constant, E denotes an applied voltage, ds denotes an area in the area R1 and ha denotes a distance from the Y-axis in the area R1.

Figure 11A:
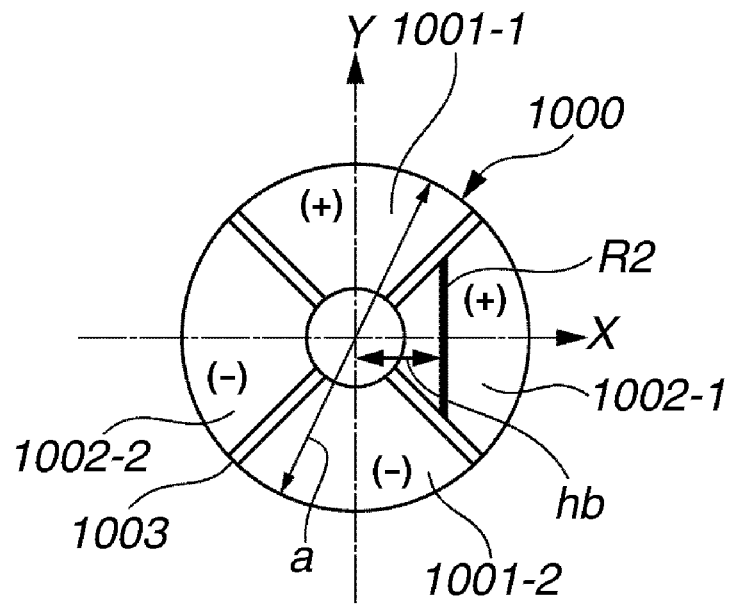
FIG. 11A illustrates a diagram showing an electrode pattern on the surface of a conventional piezoelectric element and FIG. 11B is a diagram showing the electrode pattern on the back of the conventional piezoelectric element.
Figure 11B:
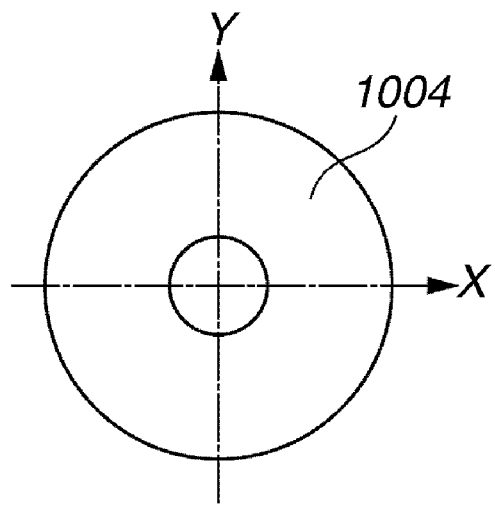

On the other hand, in a conventional disk-shaped piezoelectric element 1000 shown in FIGS. 11A and 11B, the bending strength β produced in an area R2 of a divided electrode film 1002-1 is expressed by the following equation (2):

$$\beta \propto \int_s de \cdot E \cdot ds \cdot hb \qquad (2)$$

where de denotes a piezoelectric constant, E denotes an applied voltage, ds denotes an area in the area R2 and hb denotes a distance from the Y-axis in the area R2. A diameter of the piezoelectric element 1000 shown in FIGS. 11A and 11B can have the same length "a" as one side of the transverse cross section of the piezoelectric element 200.

When the above-described equations (1) and (2) were calculated, the area of the electrode film boundaries 203 and 1003 which divide the electrode film was ignored as a sufficiently small area. Thus, a ratio of displacement γ, in which the bending vibration of the piezoelectric elements 200 and 1000 is generated, is calculated to be γ=α/β=1.5.

That is, if the following conditions are satisfied, the square piezoelectric element 200 can produce 1.5 times bending strength of a disk-shaped piezoelectric element 1000 having the same diameter a as the length of one side of the square. Namely, the piezoelectric element 200 is a square and the divided electrode films 201-1, 201-2, 202-1 and 202-2 which are divided into four parts are disposed in an area that includes the vertexes V1, V2, V3 and V4 of the square. Further, the electrode film boundary 203 dividing the electrode film is provided on a perpendicular from the mid-points M1, M2, M3 and M4 of each side. This indicates that a bending amount of the vibrator 101 which uses a piezoelectric element laminated with the piezoelectric element 200 can be made larger than the vibrator which uses the piezoelectric element laminated with the disk-shaped piezoelectric element 1000. That is, the output of the ultrasonic motor 100 can be increased. Further, if the output of the ultrasonic motor 100 which uses the piezoelectric element 200 is the same as a conventional ultrasonic motor which uses the piezoelectric element 1000, the voltage applied to the ultrasonic motor 100 can be made ⅔ times the voltage applied to the conventional ultrasonic motor. That is, the ultrasonic motor 100 which uses the piezoelectric element 200 can facilitate being driven at a low voltage.

FIG. 4 is a diagram for illustrating a comparative example of the piezoelectric element shown in FIGS. 3A and 3B in order to enable to understand features.

In FIG. 4, on the surface of a piezoelectric element 300, divided electrode films 301-1, 301-2, 302-1 and 302-2 are formed into four parts. An electrode film boundary 303 dividing the electrode films 301-1, 301-2, 302-1 and 302-2 is provided on two diagonal lines of a square. In order to increase an electrode pattern in a limited area, the electrode film boundary which does not contributes to the generation of a vibration can be made into a straight line, reducing an area occupied by the electrode film boundary. However, the piezoelectric element 300 with this electrode pattern can have a small area for the electrode film boundary and can have a smaller relative bending strength among square piezoelectric elements which have the electrode film divided into four parts by the straight line of the electrode film boundary.

Figure 5:
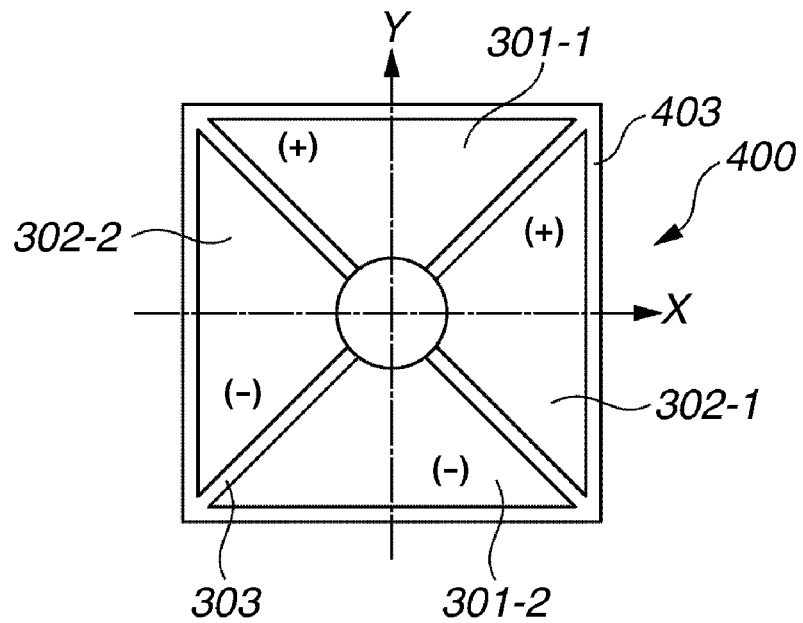
FIG. 5 illustrates a diagram showing a modified example of the electrode pattern of the piezoelectric element shown in FIG. 4.

FIG. 5 is a diagram showing a modified example of the electrode pattern of the piezoelectric element shown in FIG. 4.

In FIG. 5, a piezoelectric element 400 is different from the piezoelectric element 300 (FIG. 4) only in that an electrode film boundary 403 is formed on the outer periphery of the electrode pattern. However, if the area of the electrode film boundary 403 is made sufficiently small, the piezoelectric element 400 can be regarded as an equivalent of the piezoelectric element 300.

On the other hand, according to another exemplary embodiment, the divided electrode films 201-1, 202-1, 201-2 and 202-2 formed on the surface of the piezoelectric element 200 can include the vertexes V1, V2, V3 and V4 of a square. Aiding in the simplicity of fabrication of square electrodes deposited on a base layer with a hole 204 driven through the middle of the base layer, where the base layer not covered by the initially squared electrodes forms the film boundary layer 203. Accordingly, an inexpensive piezoelectric element 200 can be effectively facilitated. Thus, miniaturization, high power, low cost and low voltage drive of the ultrasonic motor 100 can be facilitated.

According to at least one exemplary embodiment, the electrode film boundary 203 dividing the electrode films 201-1, 201-2, 202-1 and 202-2 which are formed on the surface of the piezoelectric element 200 can be provided substantially perpendicular from the mid-points M1, M2, M3 and M4 of each side of the square. Since the electrode film boundary 203 is provided in the area which does not include the vertexes V1, V2, V3 and V4 of the square, the area occupied by the electrode film boundary 203 becomes small and the inexpensive piezoelectric element 200 can be effectively utilized. Therefore, miniaturization, high power, low cost and low voltage drive of the ultrasonic motor 100 can be facilitated.

According to at least one exemplary embodiment, the laminated piezoelectric element of a square shape is formed by laminating the square piezoelectric element 200, accordingly, square materials which are conventionally scrapped in a production process can be effectively utilized and the production process can be omitted. Thus, a cost-cutting can be achieved.

According to the exemplary embodiment, the piezoelectric element laminated with the square piezoelectric element 200 has a conversion rate from the displacement in a thickness direction of the piezoelectric element to the displacement of bending vibration of the vibrator which is higher than a conversion rate of the piezoelectric element laminated with the disk shaped piezoelectric element 1000. Therefore, even if the number of lamination of the square piezoelectric elements 200 can be fewer than the piezoelectric element laminated with the disk shaped piezoelectric element 1000, the vibrator 101 having the piezoelectric element laminated with the square piezoelectric elements 200 can obtain vibration that is similar to a vibrator 900 which has the laminated piezoelectric element laminated with the disk shaped piezoelectric elements 1000.

Further, if the electrode pattern on the surface of the square piezoelectric element 200 is ingeniously formed, the vibrator 101 of the ultrasonic motor 100 can vibrate more effectively. For example, the divided electrode films 201-1, 202-1, 201-2 and 202-2 formed on the surface of the piezoelectric element 200 can be provided in the area which includes the vertexes V1, V2, V3 and V4 of the square respectively.

Figure 6:
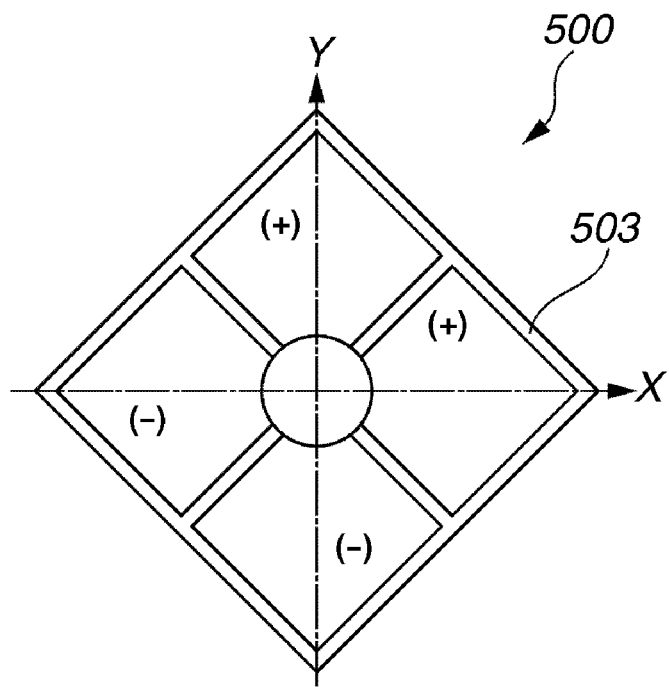
FIG. 6 illustrates a diagram showing a first modified example of the electrode pattern of the piezoelectric element shown in FIG. 3A.

According to some of the examples of the exemplary embodiments discussed, the divided electrode films 201-1, 202-1, 201-2 and 202-2 are provided in the area which includes the vertexes V1, V2, V3 and V4 of the square respectively, however exemplary embodiments are not intended to be so limited. For example, as shown in FIG. 6, an electrode film boundary 503 can be formed on the periphery of an electrode pattern of a piezoelectric element 500. Additionally FIG. 4 illustrates an exemplary embodiment where the electrode films do not contain the vertexes. In the exemplary embodiment illustrated in FIG. 6, if the area of the electrode film boundary 503 is sufficiently minimized, the piezoelectric element 500 can be regarded as an equivalent of the piezoelectric element 200 shown in FIGS. 3A and 3B.

Figure 7:
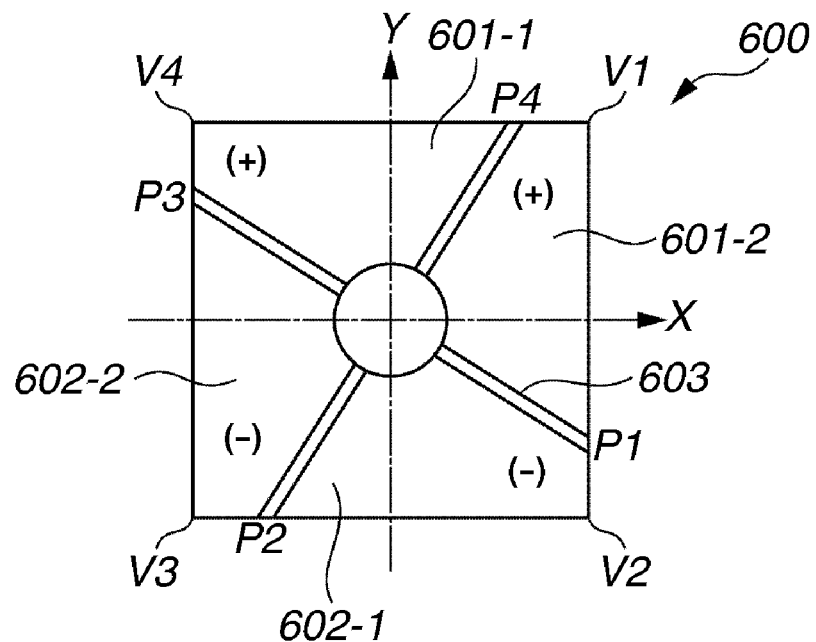
FIG. 7 illustrates a diagram showing a second modified example of the electrode pattern of the piezoelectric element shown in FIG. 3A.

According to at least one of the exemplary embodiments discussed, the electrode film boundary 203 can include the perpendicular from the mid-points M1, M2, M3 and M4 of each side of the square, however exemplary embodiments are not intended to be limited by such discussion. For example, as shown in FIG. 7, an electrode film boundary 603 dividing electrode films 601-1, 601-2, 602-1 and 602-2 can be provided on arbitrary positions P1, P2, P3 and P4 of each side.

Figure 8:
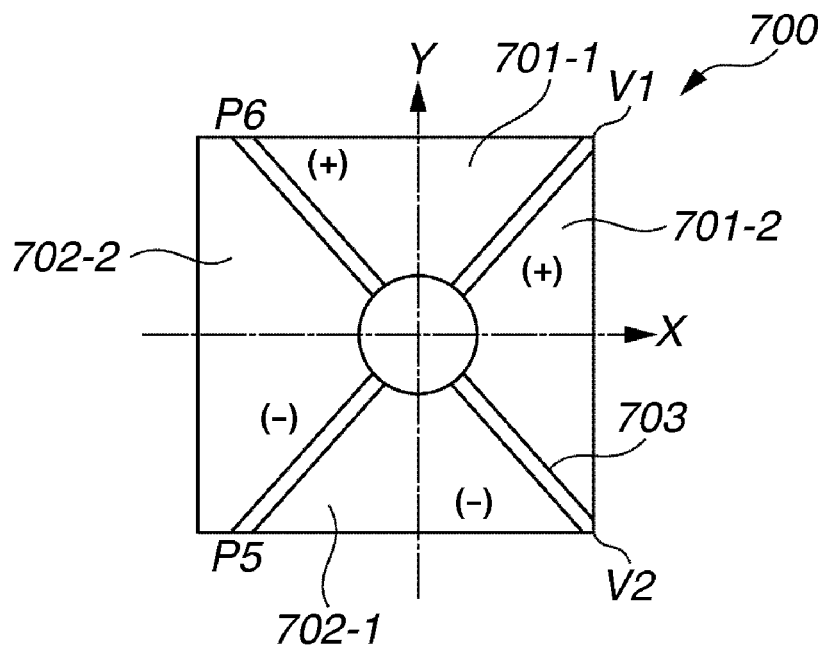
FIG. 8 illustrates a diagram showing a third modified example of the electrode pattern of the piezoelectric element shown in FIG. 3A.

According to at least one of the exemplary embodiments discussed, the piezoelectric element 200 is a square and the electrode film boundary 203 can include the perpendicular from the mid-points M1, M2, M3 and M4 of each side of the square, however exemplary embodiments are not intended to be limited by such discussion. For example, as illustrated in FIG. 8, a piezoelectric element 700 can be a rectangle, and an electrode film boundary 703 dividing electrode films 701-1, 701-2, 702-1 and 702-2 can be provided on the vertexes V1 and V2 of the rectangle, and arbitrary positions P5 and P6 of each side of the rectangle. With such an arrangement, the dynamic rigidity of two bending vibrations, which can be generated in orthogonal directions to each other by the vibrator 101, can be made different.

Figure 9:
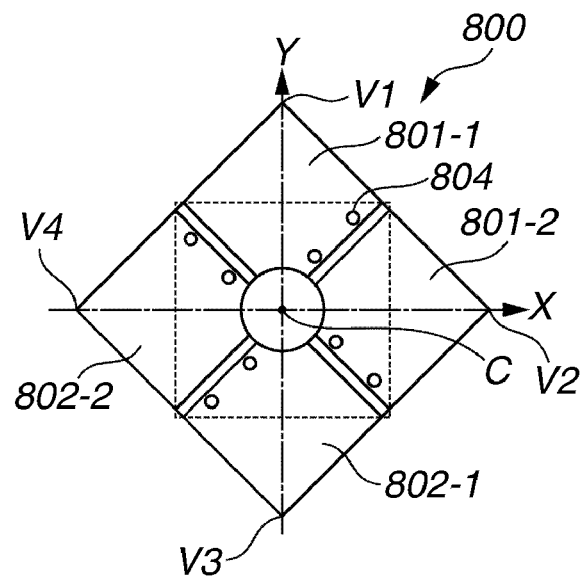
FIG. 9 illustrates a diagram showing a fourth modified example of the electrode pattern of the piezoelectric element shown in FIG. 3A.
Figure 10:
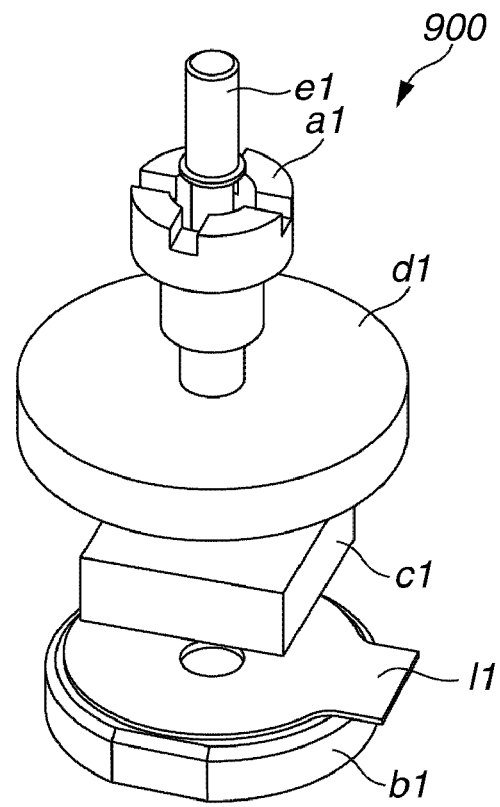
FIG. 10 illustrates an exploded perspective view of a vibrator in a conventional vibration wave driving apparatus.

Further, as illustrated in FIG. 9, in a piezoelectric element 800, a through hole (conductive part) 804 which is filled with a conductive material can be provided and this through hole 804 may be disposed in a position where a bending loss is small. This through hole 804 connects electrode films in which piezoelectric elements laminated with the piezoelectric element 800 are not the same layers. In this exemplary embodiment, the through hole 804 can be formed in an area where a distance from the center C of a square is shorter than that from the vertexes V1, V2, V3 and V4 of the square. Thus, a loss of the bending force produced in the divided electrode films 801-1, 801-2, 802-1 and 802-2 of the piezoelectric element 800 can be reduced.

In the above-described exemplary embodiments, the piezoelectric element laminated with a plurality of piezoelectric films was illustrated as an example. However, exemplary embodiments also include a piezoelectric element constituted by a single plate.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. An electro-mechanical energy converter that generates vibration by applying an AC voltage to a plurality of electrode films formed on a surface, the electro-mechanical energy converter comprising:
  four electrode films formed on the surface of the electro-mechanical energy converter, each electrode film separated from its neighbor by a boundary of non-conductive part,
  wherein a cross section cut in parallel with the electrode film of the electro-mechanical energy converter is a polygon and the boundary of non-conductive part is provided in an area that does not include the vertex of the polygon.

2. The electro-mechanical energy converter according to claim 1, wherein the divided electrode films are formed in an area that includes the vertex of the polygonal area.

3. The electro-mechanical energy converter according to claim 2, wherein the polygonal area is a square and the electrode film boundary is provided on a perpendicular from the mid-point of each side of the square.

4. An electro-mechanical energy converter provided with a plurality of layers alternately laminated with a layer having a plurality of electrode films and a material having an electro-mechanical energy converting function, that generates vibration by applying an AC voltage to the plurality of electrode films, the electro-mechanical energy converter comprising:

four electrode films on the same plane, each electrode film separated from its neighbor by a boundary of non-conductive part, wherein a cross section cut in parallel with the electrode film of the electro-mechanical energy converter is a polygon and the boundary of non-conductive part is provided in an area that does not include the vertex of the polygon.

5. The electro-mechanical energy converter according to claim 4, wherein the divided electrode films are formed in an area that includes the vertex of the polygonal area.

6. The electro-mechanical energy converter according to claim 4, wherein a conductive part configured to bring the plurality of electrode films having different layers into conduction is formed in an area where a distance from the center of the polygonal area is shorter than that from the vertex of the polygonal area.

7. The electro-mechanical energy converter according to claim 4, wherein the polygonal area is a square and the electrode film boundary is provided on a perpendicular from the mid-point of each side of the square to the center of the square.

* * * * *